United States Patent
Gogl et al.

(10) Patent No.: US 9,361,964 B1
(45) Date of Patent: *Jun. 7, 2016

(54) BOOSTED SUPPLY VOLTAGE GENERATOR FOR A MEMORY DEVICE AND METHOD THEREFORE

(71) Applicant: Everspin Technologies, Inc., Chandler, AZ (US)

(72) Inventors: Dietmar Gogl, Austin, TX (US); Syed M. Alam, Austin, TX (US); Thomas Andre, Austin, TX (US); Halbert S. Lin, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/051,794

(22) Filed: Feb. 24, 2016

Related U.S. Application Data

(62) Division of application No. 14/052,223, filed on Oct. 11, 2013, now Pat. No. 9,311,980.

(60) Provisional application No. 61/713,157, filed on Oct. 12, 2012, provisional application No. 61/712,548, filed on Oct. 11, 2012, provisional application No. 61/789,914, filed on Mar. 15, 2013.

(51) Int. Cl.
*G11C 11/00* (2006.01)
*G11C 11/16* (2006.01)

(52) U.S. Cl.
CPC .................. *G11C 11/1693* (2013.01)

(58) Field of Classification Search
CPC .......... G11C 11/16; G11C 11/15; G11C 8/10; G11C 8/08; G11C 2211/5614
USPC .............................................. 365/158, 230.06
See application file for complete search history.

(56) References Cited

U.S. PATENT DOCUMENTS

| 9,311,980 | B1 | 4/2016 | Gogl et al. |
| 2003/0021152 | A1* | 1/2003 | Le .......................... G11C 16/08 365/185.18 |
| 2007/0040599 | A1 | 2/2007 | Sato et al. |
| 2010/0177558 | A1 | 7/2010 | Sakimura et al. |
| 2012/0134228 | A1 | 5/2012 | Yu et al. |
| 2015/0029786 | A1 | 1/2015 | Andre et al. |

FOREIGN PATENT DOCUMENTS

EP  1613063 A2  1/2006

* cited by examiner

*Primary Examiner* — Huan Hoang

(57) ABSTRACT

A boosted supply voltage generator is selectively activated and deactivated to allow operations that are sensitive to variations on the boosted voltage to be performed with a stable boosted voltage. Techniques for deactivating and reactivating the voltage generator are also disclosed that enable more rapid recovery from deactivation such that subsequent operations can be commenced sooner. Such techniques include storing state information corresponding to the voltage generator when deactivated, where the stored state information is used when reactivating the voltage generator. Stored state information can include a state of a clock signal provided to the voltage generator.

20 Claims, 3 Drawing Sheets

BOOSTED SUPPLY VOLTAGE GENERATOR FOR A MEMORY DEVICE AND METHOD THEREFORE

CROSS REFERENCE TO RELATED APPLICATIONS

This application is a divisional of U.S. patent application Ser. No. 14/052,223 filed Oct. 11, 2013. This application and application Ser. No. 14/052,223 claim priority to U.S. Provisional Application No. 61/713,157 filed Oct. 12, 2012, U.S. Provisional Application No. 61/712,548 filed Oct. 11, 2012, and U.S. Provisional Application No. 61/789,914 filed Mar. 15, 2013. The contents application Ser. Nos. 14/052,223, 61/713,157, 61/712,548, and 61/789,914 are incorporated by reference herein in their entirety.

TECHNICAL FIELD

The disclosure herein relates generally to memory devices and more particularly to circuits and methods for providing a supply voltage for driving word lines in such memory devices.

BACKGROUND

Resistive memory devices store information by varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetoresistive layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Writing magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages where the applied voltages result in the desired current. Depending on the direction of the current through the memory cell, the resulting magnetization of the free portion will either be parallel or antiparallel to the fixed portion. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

In order to selectively apply the currents used to sense the stored information in memory cells and write information to those memory cells, selection transistors are often included in series with each memory cell. When the selection transistor is selected by applying the appropriate voltage to its control node, current is allowed to flow through the memory cell for the sensing and writing operations. As discussed above, the various sensing and writing operations in memory devices can require currents of different magnitudes and directions to flow through the memory cells. Therefore, it is desirable to provide circuits and methods for selection of memory cells for such operations that promote accurate and effective sensing and write operations.

DETAILED DESCRIPTION

Figure 1:
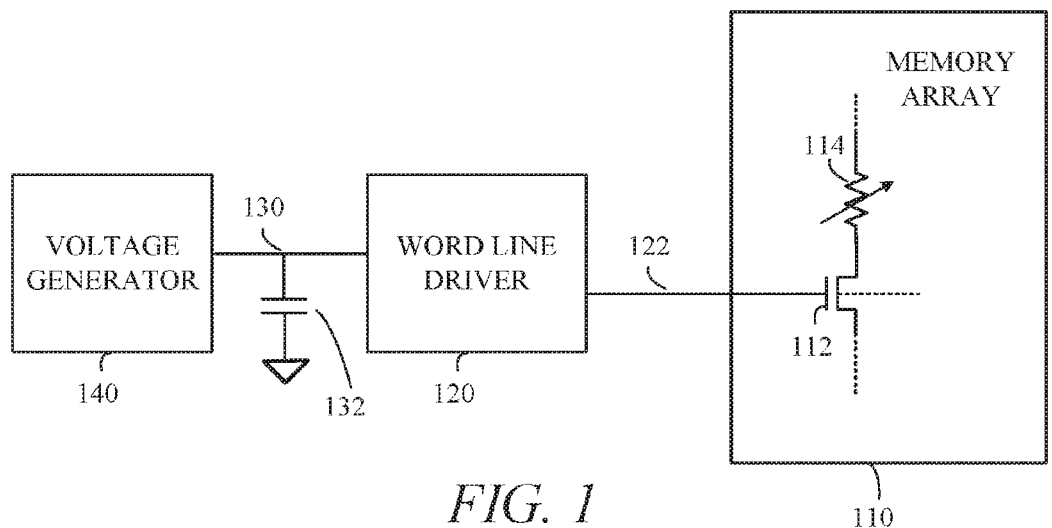
FIG. 1 is a block diagram of a portion of a memory device including word line driver circuitry in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

FIG. 1 is a block diagram showing a portion of an example memory device that includes a memory array 110 having a plurality of memory cells. Only one memory cell 114 is depicted in FIG. 1, but one of ordinary skill in the art understands that memory array 110 includes a plurality of memory cells arranged in rows and columns. In one embodiment, the memory cells are resistive memory elements where information stored in each memory cell is represented by different amounts of resistance perceived by current flowing through the memory cell. Examples of such memory cells include magnetoresistive random access memory (MRAM) cells including spin-torque MRAM cells. In one embodiment, each of the memory cells includes an MTJ where the resistance through the memory cells indicates the information stored in the memory cell.

Each of the memory cells in the memory array 110 has a corresponding selection transistor that allows the particular memory cell to be selected for read and write operations. For example, memory cell 114 can be selected using selection transistor 112. The selection transistors, including selection transistor 112, are preferably thin-oxide devices with low threshold voltage for a higher current drive capability. Such thin-oxide devices are often used in logic configurations that rely on a logic supply voltage having a voltage level specified as the appropriate voltage for thin gate oxide devices in such a logic configuration. Each corresponding set of a selection transistor and corresponding memory cell is coupled in series between a source line and a bit line. For example, memory cell 114 is coupled in series with selection transistor 112 between a bit line and a source line, which are not shown in FIG. 1.

Each of the rows of memory cells can be selected for read and write operations based on a corresponding word line being asserted. In FIG. 1, word line 122 is used to select the memory cell 114 using selection transistor 112. Word line 122 is also provided to the control input of other selection transistors corresponding to the memory cells in the same row as memory cell 114. As such, when word line 122 is asserted, the selection transistors corresponding to a group of the memory cells in the selected row that includes memory cell 114 will allow current to flow through their respective memory cells. Each row may include hundreds or thousands of memory cells, and the memory device will include many rows in the array. In some embodiments, when the word line is asserted the selection transistors for all of the memory cells in the row allow current flow through their respective memory cells, whereas in other embodiments, the word line may only cause a portion of the selection transistors in the row to allow current flow through their respective memory cells. Similarly, in other embodiments, a word line driver may drive selection transistors corresponding to memory cells that are not all in the same array or are not in a continuously adjacent grouping. For example, the word line driver may drive the selection transistor corresponding to every other memory cell in a physical row of memory cells such that only 1 in every 2 memory cells in the row is selected. In another embodiment, one word line driver may drive selection transistors in multiple arrays. In yet another embodiment, voltages applied to bit lines and source lines may selectively control the current flow through a subset of the selection devices driven by the word line.

The word line driver 120 drives the word line 122 when the row of memory cells corresponding to word line 122 is selected for reading or writing operations. Selection of the row corresponding to word line 122 is based on address information provided to the memory device that determines which of the rows of memory cells is to be accessed for reading or writing. The decoding circuitry that decodes the address information may be included in the word line driver 120 shown in FIG. 1, but such circuitry is typically shared such that portions of the decoding circuitry may be used by many word line drivers.

The source lines and bit lines are used in both reading and writing the memory cells, including memory cell 114. Sense amplifiers and write drivers associated with the source lines and bit lines, which are also not shown in FIG. 1, enable read and write currents to be passed through selected memory cells to both store information and later retrieve that information. Examples of such sense amplifiers, write drivers, and related circuitry are discussed in U.S. application Ser. No. 13/362, 599.

In one embodiment, when one or more memory cells in a row are to be accessed, the information stored in each of the memory cells to be accessed is sensed and stored in local data-store latches. Such an operation is sometimes referred to as an activate operation, and the one or more cells whose information is stored in the local data-store latches can be referred to as a "page." In accordance with the disclosure in U.S. application Ser. No. 13/362,599, the activate operation can include a self-referenced read operation that determines the information stored in each of the memory cells in the selected page. The self-referenced read operation includes first sampling the resistance of each of the memory cells in the selected page. After sampling the resistance of the memory cells, the memory cells are all written to a first state. For example, all of the memory cells may be written to a logical "0." Following the write to the entire page of memory cells, the resistance of each of the memory cells is sampled again and compared with the previous sample taken from the same memory cell before the write operation. Based on the comparison, the original state of the memory cell (i.e. "1" or "0") can be determined based on whether or not the resistance changed significantly as a result of the writing operation. Once the activate operation is complete and the information from the selected page is in the local data-store latches, read and write operations can be performed by retrieving data from and storing data into the local data-store latches. Such a self-referenced read ensures that deviations between the resistance values of different memory cells do not impact the ability to sense the information stored therein.

In order to perform a valid comparison between the original resistance of the memory cell and the resistance of the memory cell after being written to a known state, the resistance of the associated selection transistor connected in series with the memory cell should be stable and consistent during both sensing operations. For example, the on-resistance of transistor 112 should be the same when a first sense current samples the resistance of memory cell 114 as it is when, after all the memory cells in the selected page are written to the same state, a second sense current determines the resistance of the memory cell 114 again. Inconsistencies in the resistance of the selection transistor 112 during such self-referenced read operations could result in a reduced ability to detect the stored logic state in the memory cell 114.

In order to provide increased densities in memory devices, it is desirable to minimize the integrated circuit area needed for the memory cells as well as the associated control circuitry. Minimizing the area required for each of the selection transistors 112 results in such devices having smaller widths, which in turn increases the on-resistance of the selection transistor 112 when word line 122 is driven. Because having a low on-resistance for the selection transistor 112 is desirable for many reasons, including allowing more accurate detection of resistance changes in memory cell 114, higher word line voltages can be used to decrease the on-resistance of the selection transistor 112 while still allowing it to have a smaller width. A higher word line voltage on word line 122 results in greater gate-source voltage (VGs) on selection transistor 112, which in turn results in a lower resistance across the selection transistor 112 in the series connection with memory cell 114. Such higher, or "boosted," word line voltages are greater in magnitude than the logic supply voltage for the memory device.

In the embodiment depicted in FIG. 1, such a boosted word line supply voltage is generated at node 130, which is coupled to the word line driver 120. The word line driver 120 uses this word line supply voltage, which is greater than the logic supply voltage for the memory device, to drive the word line 122. The node 130 includes capacitance 132, which serves as a charge reservoir. Although shown as a single capacitor, capacitance 132 would include the distributed capacitance of the traces and inputs of circuit elements connected to the node 130. For example, the capacitance 132 would include the input capacitance of the portions of the word line driver circuitry 120 that are connected to the node 130. The capacitance 132 can also include one or more decoupling capacitors formed on the memory device.

In order to generate the boosted word line supply voltage at node 130, a voltage generator 140 is provided, where the voltage generator provides additional charge to the node 130 to boost the voltage level above that of the logic supply voltage for the memory device. In one embodiment, the voltage generator 140 includes a charge pump. Charge pumps are known in the art and commonly used to provide such a boosted voltage level in integrated circuits. In such an embodiment, generating the word line supply voltage would include activating the charge pump to provide additional charge to the node 130. Voltage generators capable of providing for such boosted voltage levels can inject additional noise in the resulting supply voltages. For example, a charge pump typically performs a series of discrete voltage pumping steps where each pumping step provides a discrete quantity of charge to the capacitance at which the boosted voltage level is being generated. As a part of each voltage pumping step, internal nodes within the charge pump are first charged using an available supply voltage and then discharged to move that charge onto the node having the capacitance capable of storing that additional charge.

In a system such as that depicted in FIG. 1, noise on the word line supply voltage at node 130 can have a detrimental impact on operations, including those associated with the self-referenced reading discussed above. Specifically, noise on the word line supply voltage at node 130, which is used by the word line driver 120 to drive the word line 122, can translate to variations on the voltage level on the word line 122 while it is being driven. Such variations can result in variations in the resistance across the selection transistor 112 in series with the memory cell 114, thereby reducing the precision with which the resistance across the memory cell 114 can be detected. Because the resistance across the memory cell 114 is representative of the logic state stored therein, avoiding fluctuations in the resistance of the selection transistor 112 is desirable.

In order to reduce noise and fluctuations on the word line supply voltage at node 130 during the operations that are sensitive to variations on the voltage level on the word line 122, the voltage generator 140 is deactivated during those sensitive operations. For example, during the self-referenced read operations discussed above with respect to an activate operation, the voltage generator 140 is deactivated in order to minimize noise at node 130, which serves as the word line supply voltage for the word line driver 120. When the voltage generator 140 is deactivated, the charge stored on the capacitance 132 coupled to node 130 supplies the power needed to drive the word line 122. By protecting the word line supply voltage at node 130 from noise resulting from the voltage generator 140, variations in the word line voltage on word line 122 are reduced, thereby allowing for more accurate sensing and comparison of the resistance across the memory cell 114. Although described in the context of a self-referenced read operation in a magnetic memory device, one of ordinary skill in the art understands that deactivating the voltage generator 140 to reduce noise is also applicable to other operations performed within the memory device that may be sensitive to noise on the boosted supply voltage.

Figure 2:
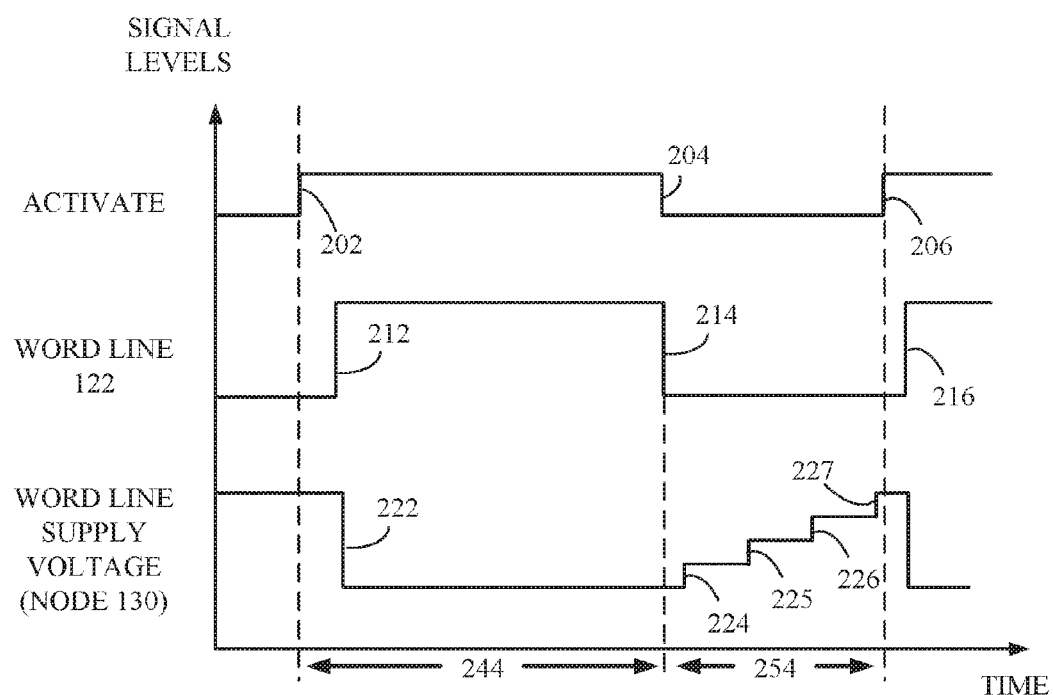
FIG. 2 is a timing diagram showing timing of signal level transitions associated with driving a word line in accordance with an exemplary embodiment.

FIG. 2 illustrates a timing diagram corresponding to activation operations in a memory device in which a boosted word line supply voltage is used to drive the word lines for the selected rows in the memory device. The timing diagram is provided to aid in describing the sequence of operations within a memory device such as that depicted in FIG. 1, and the signal names and levels are exemplary in nature and not intended to be limiting. During a first activate operation, a first transition 202 signals the beginning of a self-referenced read operation. Because, as described above, the self-referenced read operation is sensitive to variations of the voltage level on the word line 122, the voltage generator 140 is disabled during that operation. The time period 244 between the vertical dashed lines corresponding to the beginning and end of the first activate operation indicates when the voltage generator 140 is deactivated. While the time period 244 depicted shows the voltage generator 140 being deactivated prior to the word line 122 being driven at edge 212, in other embodiments, the voltage generator 140 is deactivated prior to the beginning of the operation sensitive to variations on the word line 122, which may occur after the word line 122 is initially driven.

While the word line 122 is driven between edges 212 and 214, the self-referenced read takes place, which, as described above, includes first sensing the resistance of the memory cells in the row, then writing a known logic state to all of the memory cells, and then another sensing operation where the two sensed resistances for each memory cell are compared to determine the logic state originally stored in the memory cell. During this time, the deactivation of the voltage generator 140 helps to minimize fluctuations on the voltage level on the word line. Such improved stability of word line voltage improves the ability to accurately detect the logic state stored in the memory cell.

While the voltage generator 140 is deactivated the power necessary to drive the word line 122 can be drawn from the charge stored in the capacitance 132 of the word line supply voltage at node 130. In one embodiment, decoupling capacitors provide the charge storage needed for driving the word line during this time period, and those capacitors are isolated from any noise generated by the voltage generator 140 during sensitive operations. As shown in FIG. 2, driving the word line 122 depletes some or all of the charge previously provided by the voltage generator 140 to the word line supply voltage. Although this is shown as an abrupt transition 222, one of ordinary skill in the art appreciates that depletion of charge on the node may be more gradual. FIG. 2 shows that after completion of the self-referenced read corresponding to the initial activate operation, additional charge needs to be provided to the word line supply voltage before a subsequent operation requiring a boosted word line supply voltage can begin.

In many prior art systems employing charge pumps, when the desired boosted voltage level supply falls below a certain lower threshold, the charge pump immediately begins refreshing that depleted charge. Such automatic charge replenishment without regard for ongoing operations that benefit from a stable supply voltage can result in adverse noise and voltage fluctuations resulting from the charge pump being active at inopportune times. As described herein, by deactivating the charge pump during sensitive operations, more reliable performance of the operations is permitted.

In addition to showing relative timing of deactivation of the voltage generator 140 with respect to an activate operation, FIG. 2 also depicts time period 254 during which the voltage generator 140 is reactivated and charge is again provided to the word line supply voltage. Once the initial activate operation has completed, which corresponds to falling edges 204 and 214, the voltage generator 140 is reactivated. Consistent with embodiments in which the voltage generator 140 includes a charge pump, FIG. 2 depicts the word line supply voltage being gradually built back up in steps 224-227. Each of the steps 224-227 corresponds to a pumping step by the charge pump that adds charge to the word line supply voltage. Because a sensitive operation is not being performed while the pumping steps rebuild the charge, any noise or variations in the word line supply voltage will not have an adverse impact. Once the word line supply voltage has reached a target charge level that is greater than the logic supply voltage for the memory device, a subsequent activate operation or another operation that uses such a boosted word line supply voltage can begin (e.g. edges 206 and 216 in FIG. 2) and the voltage generator can be deactivated once again. Such a subsequent operation could select the same row or a different row. One of ordinary skill in the art understands that the circuitry used to generate the boosted word line supply voltage can be shared between many word line driver circuits, but also understands that more than one instantiation of such circuitry can be included in a memory device to allow interleaving of operations that rely on different or isolated word line supply voltages generated at different nodes. These different or isolated word line supply voltages may allow an activation period to charge one word line supply voltage, for example, associated with one bank in a memory, while allowing a deactivation period during a self-referenced read operation to occur at substantially the same time, for example, in another bank of the memory.

In order to minimize the time between operations relying on the same boosted word line supply voltage, minimizing the time 254 required to return the word line voltage to the target charge level is desirable. This is especially true in high speed memory operations. This time 254, which may be referred to as a voltage regeneration window, can be reduced by improving the efficiency of the voltage generator reactivation. As discussed in more detail below, one way to increase efficiency is to control the reactivation such that it is done in a manner that ensures a pump step like those shown in FIG. 2 (steps 224-227) occurs as quickly as possible after reactivation.

Figure 3:
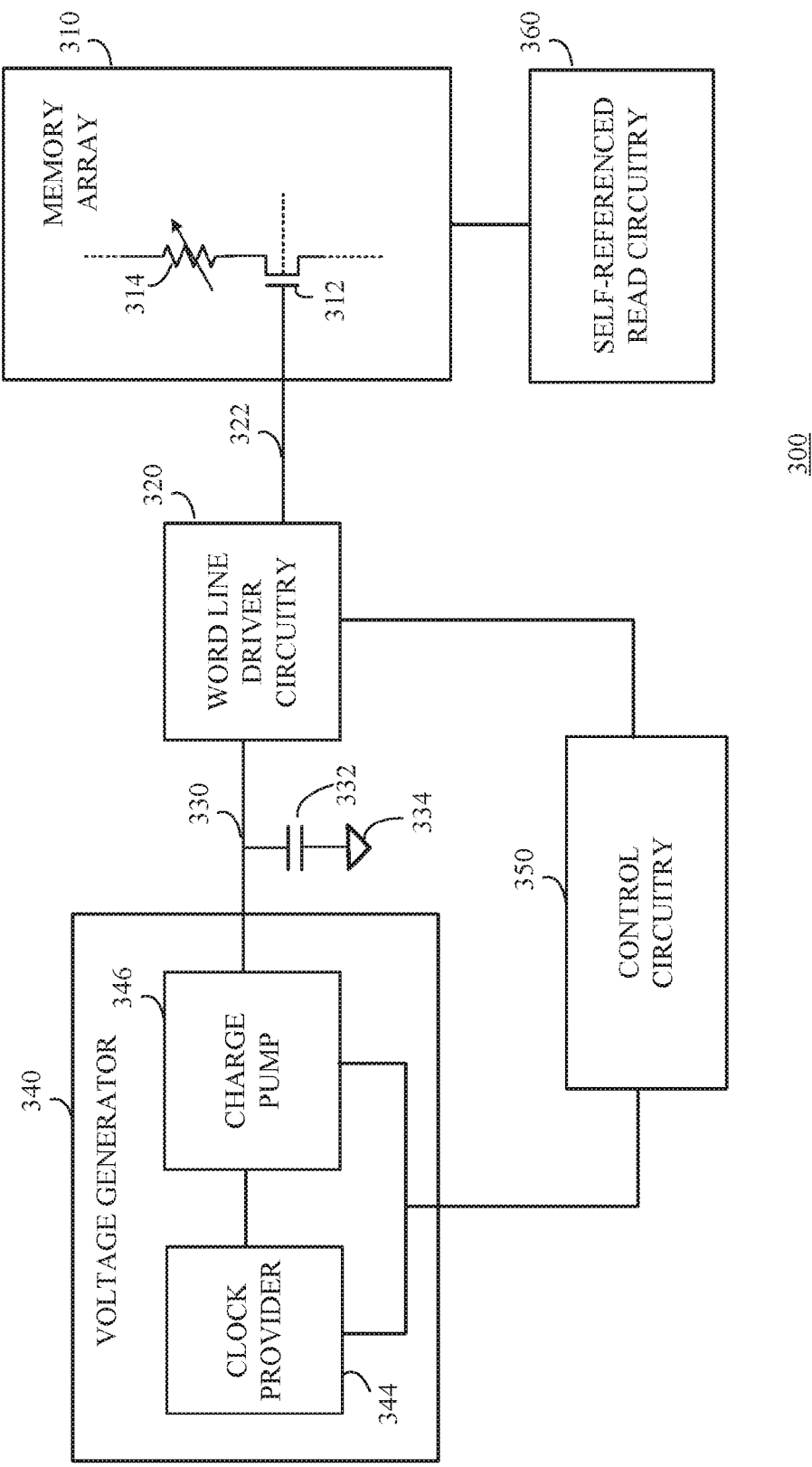
FIG. 3 is a block diagram of a portion of a memory device including word line driver circuitry and related control circuitry in accordance with an exemplary embodiment.

Turning now to FIG. 3, a memory device 300 that includes word line driver circuitry 320 using a boosted word line supply voltage is illustrated. The memory device 300, which in one embodiment is a magnetic memory device, includes an array 310 of memory cells arranged in rows and columns. In one embodiment, the memory cells are spin-torque MRAM cells. The memory device includes self-referenced read circuitry 360 coupled to the memory array 310. As described above with respect to the activate operation, the self-referenced read circuitry 360 is configured to determine the stored logic state in each of the memory cells in a selected row by performing a sequence of steps including sensing, writing, and sensing again after which a comparison of the sensed resistance values is performed. As also discussed above, the sensing operations are sensitive to variations in the word line voltage on the word line corresponding to the selected row of memory cells. For example, when the word line 322 is driven by the word line driver circuitry 320 and the row of memory cells that includes memory cell 314 is selected, the self-referenced read circuitry 360 will determine the logic state stored in memory cell 314 as well as the rest of the memory cells that are selected using the word line 322. During that operation, control circuitry 350, which is coupled to the voltage generator 340 and the word line driver circuitry 320, deactivates the voltage generator 340 to reduce noise or other variations in the word line supply voltage that is used by the word line driver circuitry 320 to drive the word line 322. The control circuitry 350 can also be coupled to the self-referenced read circuitry 360 in order to provide control to or receive status information from the self-referenced read circuitry 360.

In the embodiment shown in FIG. 3, the voltage generator 340 includes a charge pump 346. The charge pump 346 is coupled to the node 330, where capacitance 332 at the node 330 is configured to store charge corresponding to the word line supply voltage. As was the case with capacitance 132 in FIG. 1, the capacitance 332 can include discrete decoupling capacitors as well as other forms of capacitance, including distributed capacitance associated with circuit element inputs and the connection traces of the integrated circuit. In the embodiment shown, the capacitance 332 is referenced to ground 334, but one of ordinary skill in the art understands that it may be referenced to an alternate voltage, including the logic supply voltage.

The charge pump 346 is configured to provide charge to the node 330 so that a desired word line supply voltage is established based on a target charge level, where the word line supply voltage has a greater magnitude than a logic supply voltage for the memory device 300. The word line supply voltage generated at node 330 is used by the word line driver circuitry 320 to drive the word line 322. As discussed above with respect to FIG. 1, the word line driver circuitry 320 may include address decoding circuitry and be configured to drive a selected word line of a plurality of word lines based on the address information provided to the memory device 300.

A clock provider 344 is coupled to the charge pump 346, where the clock provider 344 is configured to provide a clock to the charge pump 346 when the charge pump 346 is activated. The clock provider 344 may be an oscillator, such as a ring oscillator, or other form of clock generator that provides a signal having defined phases that are used by the charge pump 346 for charging internal nodes and then discharging those nodes to place additional charge on node 330. For example, in a very simple charge pump, a square wave clock can allow the internal nodes to be charged while the clock is low and the same nodes to discharge their charge to the node 330 when the clock is high. More complex charge pumps that include more than one set of internal nodes for charging and discharging and that work with more complex clocks are well known in the art. While the specifics of those charge pumps are not discussed herein, it is understood that there is an optimal ordering of operations internal to the charge pump 346 to result in efficient pumping of charge onto the node 330.

In order to deactivate the charge pump 346, the control circuitry 350 prevents the clock from causing the charge pump 346 to step through the pumping operations. This can be accomplished by gating off the clock so the clock doesn't reach the charge pump 346 or by stopping the clock provider 344. For example, in the case of a ring oscillator, the ring may be broken such that oscillation stops. In another embodiment, the output of the charge pump 346 may be isolated from node 330.

As discussed above, it is desirable to minimize the time needed to return the node 330 to its fully charged state after completion of an operation that resulted in the charge pump 346 being deactivated. In one embodiment, the charge pump 346 can be prepared for reactivation prior to that reactivation. Such preparation includes precharging certain internal nodes of the charge pump 346 so that the charge pump 346 will start with charged internal nodes immediately upon reactivation.

In order to optimize reactivation of the charge pump 346, the control circuitry 350 can also be configured to store state information reflecting the state of the clock when the charge pump 346 is deactivated. In one embodiment, the control circuitry 350 includes state storage circuitry configured to store the state of the clock, whereas in other embodiments, the state storage circuitry may be in the voltage generator 340 or elsewhere in the memory device 300. When the charge pump 346 is reactivated following the sensitive operation, the stored state of the clock can be used to optimize the reactivation of the charge pump 346.

In some embodiments, the clock provided by the clock provider 344 is free running such that it will continue to oscillate even when the charge pump 346 is deactivated. Typically, the free-running clock provided to the charge pump 346 by the clock provider 344 is asynchronous to the clock provided to the memory device that governs the synchronous performance of activate or other noise-sensitive operations. Because of this asynchronous relationship, the time at which the sensitive operation completes and the charge pump 346 can be reactivated may correspond to a point in time where the phase of the clock provided by the clock provider 344 is very different from the phase of the clock when the charge pump 346 was deactivated. For example, the clock may have been just about to transition from low to high, which would have resulted in charged nodes within the charge pump 346 transferring that charge to the node 330. If reactivation of charge pump 346 happens to correspond to the phase of the clock where it has just completed a low to high transition, nearly an entire period of that clock will occur before the next low to high transition, which, in the example provided, will result in a pump step putting charge on the node 330. Not only is the waiting time for that next rising edge detrimental in adding delay before the next operation can commence, but the operation of the charge pump 346 in response to the mismatch between the clock phase at deactivation and the clock phase at reactivation can cause other undesirable effects such as unnecessary power consumption.

Therefore, by using the stored state of the clock when reactivating the charge pump 346 the charge pump 346 can be prepared for an optimum start condition. In other embodiments, the clock provided to the charge pump 346 can be modified to take advantage of the state of the charge pump 346 when it was deactivated. In the example above, where the clock was just about to transition from low to high at deactivation and the clock had just made a low to high transition when reactivation is appropriate, the clock could be modified to convert the subsequent high to low transition to a low to high transition. Such a modification to the clock would reduce the waiting time before a pump step places charge on the node 330 by about one-half of a cycle of the clock provided to the charge pump 346. Other techniques can be used to modify or shift the clock at reactivation to match the stored phase of the clock at deactivation in order to allow the charge pump 346 to start up essentially where it left off.

As one of ordinary skill in the art recognizes, being able to reactivate a charge pump in the manner disclosed herein would also be beneficial in other high speed systems in which quick regeneration of a boosted voltage level is desired following deactivation of the charge pump.

Figure 4:
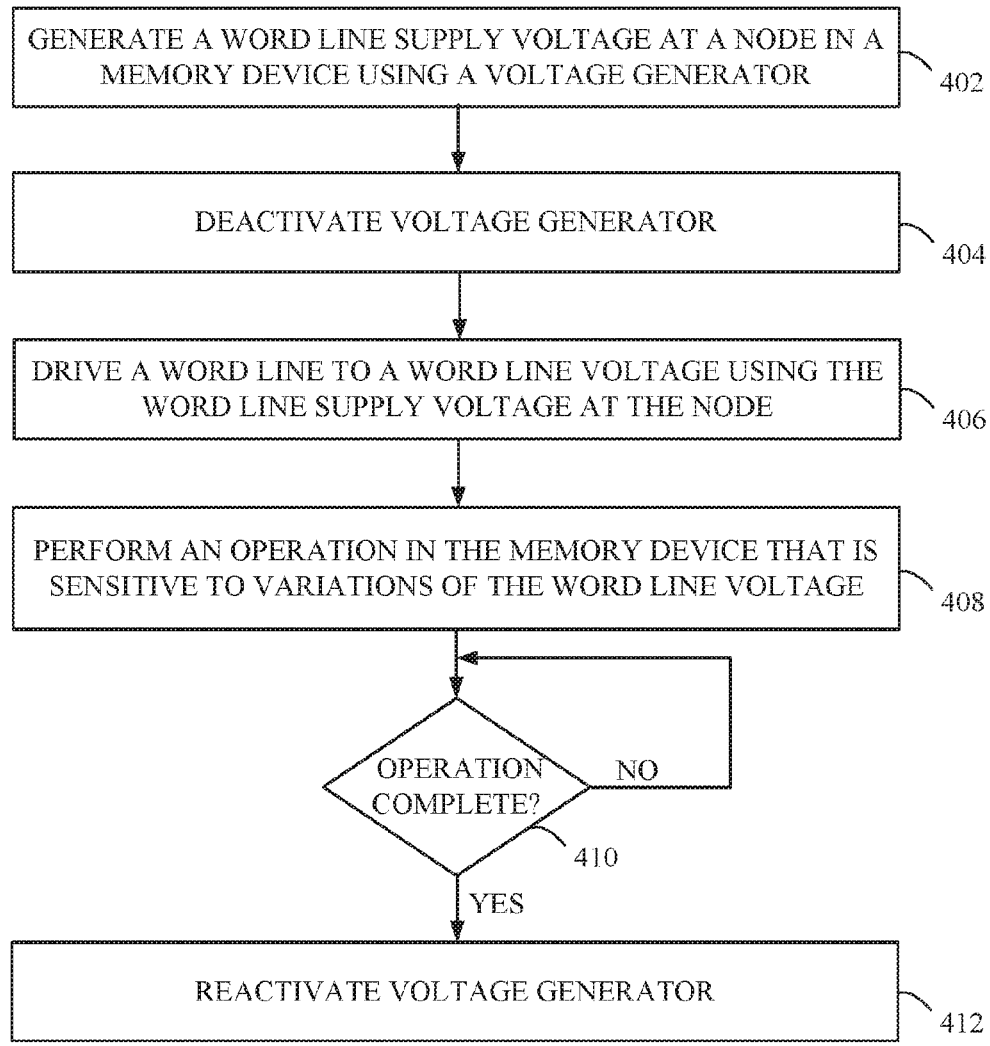
FIG. 4 is a flow chart of a method of operation for providing a word line supply voltage in association with driving a word line in a memory device in accordance with an exemplary embodiment.

FIG. 4 illustrates a flow diagram of a method of providing a word line voltage on a word line in a memory device. At step 402 a word line supply voltage is generated at a node in the memory device using a voltage generator. The node at which the word line supply voltage is generated includes capacitance or some other charge storing circuit structure that allows the voltage generator to store enough charge at the node to produce a word line supply voltage that is greater in magnitude than the logic supply voltage for the memory device. In one embodiment, generating the word line supply voltage includes activating a charge pump to provide charge to the node.

At step 404 the voltage generator is deactivated such that it is no longer providing charge to the node. Because it is no longer providing charge to the node, voltage fluctuations and noise on the node are reduced in comparison to times when the voltage generator is active and providing charge to the node. Deactivating the voltage generator may include deactivating a charge pump in embodiments where a charge pump provides the charge to the node to generate the word line supply voltage. In such embodiments, deactivating the charge pump can be accomplished by stopping the provision of a clock to the charge pump. For example, generation of the clock can be stopped or the clock can be gated off from the charge pump.

At step 406 a word line is driven to a word line voltage using the word line supply voltage at the node. Driving the word line voltage may include decoding address information to determine that the word line is to be driven and may also include a determination that the particular word line supply voltage at the node is the appropriate supply voltage to use for the particular operation to be performed. For example, the memory device may include multiple word line supply voltages that are greater than the logic supply voltage where different word line supply voltages are used for writing different states to the memory cells in the row corresponding to the selected word line.

At step 408 an operation is initiated in the memory device, where the operation is sensitive to variations on the word line voltage. In one embodiment, the operation is a sensing operation that senses information stored in memory cells in the memory device corresponding to the word line being driven. Such a sensing operation may be a part of a self-referenced read operation such as those discussed in more detail above. Additionally, while the flow diagram of FIG. 4 shows the voltage generator being deactivated before the word line is driven, in other embodiments, the word line may be driven before the voltage generator is deactivated. In order to avoid adverse impacts of noise and voltage fluctuations resulting from the voltage generator, the voltage generator is deactivated before the operation sensitive to variations on the word line voltage begins. As one of ordinary skill in the art appreciates, as long as the deactivation occurs before sensitivity to variations is present, a stable word line voltage can be provided throughout the relevant portion of the operation.

At step 410 it is determined whether or not the operation is complete. Such a determination may be specific to determining that the portion of the operation that is sensitive to variations of the word line voltage is complete. If the sensitive portion of the operation is complete, the potential variations and noise from the voltage generator being active do not adversely impact the operation. If the operation or relevant portion of the operation is not yet complete, the voltage generator is maintained in a deactivated state.

When it is determined at step 410 that the operation, or at least the relevant portion of the operation, is complete, the method proceeds to step 412 where the voltage generator is reactivated. In embodiments where deactivating the voltage generator includes deactivating a charge pump, the charge pump may be prepared for reactivation before being reactivated. Such preparation may include charging internal nodes within the charge pump such that it is capable of charging the node to the desired voltage more quickly upon reactivation such that a subsequent operation can be commenced sooner. In other embodiments where provision of the clock to the charge pump is stopped, reactivation includes providing the clock to the charge pump, where such provision may be based on the state of the clock as stored at the time of deactivation. In yet other embodiments in which stopping provision of the clock includes locking the state of the clock at the point in time at which the provision of the clock is stopped, reactivating the charge pump may include precharging nodes internal to the charge pump to correspond to the state of the clock as locked and providing the clock to the charge pump based on the state of the clock as locked.

Many options for reactivating the voltage generator are available that improve the ability of the voltage generator to quickly charge the node to the desired voltage level. Being able to reach that desired voltage level more quickly enables subsequent operations to be commenced sooner, which is beneficial in high speed memory devices such as spin-torque MRAMs.

While exemplary embodiments have been presented above, it should be appreciated that many variations exist. Furthermore, while the description uses spin-torque MRAM devices that include an MTJ in the exemplary embodiments, the teachings may be applied to a memory array comprising any resistive memory elements or to any other circuit in which noise reduction by disabling a voltage generator, which may include a charge pump, may be desirable. It should also be appreciated that the exemplary embodiments are only examples, and are not intended to limit the scope, applicability, or configuration of the inventions in any way.

What is claimed is:

1. A method of providing a boosted voltage on a signal line on a device, comprising:
   generating a first supply voltage at a node using a voltage generator, wherein magnitude of the first supply voltage is greater than that of a logic supply voltage for the device;
   detecting a signal transition signaling a beginning of an operation in the device that is sensitive to variations of the boosted voltage;
   driving the signal line to the boosted voltage using the first supply voltage at the node;
   while driving the signal line using the first supply voltage at the node, performing the operation in the device that is sensitive to variations of the boosted voltage;
   while performing the operation, maintaining the voltage generator in a deactivated state; and
   reactivating the voltage generator when the operation in the device that is sensitive to variations of the boosted voltage is complete.

2. The method of claim 1, further comprises deactivating the voltage generator before driving the signal line to the boosted voltage.

3. The method of claim 1, further comprises deactivating the voltage generator before performing the operation.

4. The method of claim 1, wherein driving the signal line to the boosted voltage using the first supply voltage at the node further comprises driving a word line in a magnetic memory device.

5. The method of claim 1, wherein:
   maintaining the voltage generator in the deactivated state includes:
      deactivating the voltage generator; and
      storing state information corresponding to deactivation of the voltage generator; and
   reactivating the voltage generator uses the state information.

6. The method of claim 5, wherein:
   deactivating the voltage generator includes stopping provision of a clock to the voltage generator;
   storing the state information includes storing a state of the clock when the provision of the clock is stopped; and
   reactivating the voltage generator includes providing the clock to the voltage generator based on the state of the clock as stored.

7. The method of claim 6, wherein the voltage generator includes a charge pump, and the method further comprises:
   prior to reactivating the voltage generator, precharging nodes internal to the charge pump to correspond to the state of the clock as stored.

8. A circuit comprising:
   a node that includes capacitance configured to store charge corresponding to a boosted supply voltage;
   a voltage generator coupled to the node, the voltage generator configured to provide charge to the node such that, at a target charge level, the boosted supply voltage is greater than a logic supply voltage for a device on which the circuit is included;
   state storage circuitry;
   control circuitry coupled to the voltage generator and the state storage circuitry, the control circuitry configured to:
      detect a signal transition signaling a beginning of an operation in the device that is sensitive to variations of the boosted supply voltage;
      deactivate the voltage generator in response to detection of the signal transition;
      store state information in the state storage circuitry, the state information corresponding to the voltage generator when the voltage generator is deactivated; and
      reactivate the voltage generator when the operation in the device is complete, wherein the control circuitry uses the state information stored in the state storage circuitry in reactivating the voltage generator.

9. The circuit of claim 8, wherein the voltage generator includes a charge pump, and wherein the control circuitry is configured to deactivate the charge pump when deactivating the voltage generator.

10. The circuit of claim 9, wherein the control circuitry is configured to deactivate the charge pump by stopping provision of a clock to the charge pump.

11. The circuit of claim 10, wherein the state storage circuitry is configured to store a state of the clock when the control circuitry stops provision of the clock to the charge pump, and wherein the control circuitry is configured to reactivate the voltage generator by providing the clock to the charge pump based on the state of the clock as stored in the state storage circuitry.

12. The circuit of claim 10, wherein the control circuitry is configured to reactivate the voltage generator such that reactivation includes modifying a clock provided to the charge pump based on state of the charge pump when the charge pump is deactivated.

13. The circuit of claim 10, wherein the control circuitry is configured to precharge internal nodes of the charge pump prior to reactivation of the voltage generator.

14. A method of providing a boosted voltage at a node on a device, comprising:
   generating the boosted voltage at the node using a voltage generator, wherein magnitude of the boosted voltage is greater than that of a logic supply voltage for the device;
   detecting a signal transition signaling a beginning of an operation in the device that is sensitive to variations of the boosted voltage;
   in response to the signal transition signaling the beginning of the operation:
      deactivating the voltage generator; and
      storing state information corresponding to deactivation of the voltage generator; and
   reactivating the voltage generator when the operation in the device that is sensitive to variations of the boosted voltage is complete, wherein reactivating the voltage generator uses the state information as stored.

15. The method of claim 14, wherein deactivating the voltage generator includes stopping provision of a clock to the voltage generator, wherein the state information includes a state of the clock signal when the provision of the clock is stopped; and
   wherein reactivating the voltage generator includes providing the clock to the voltage generator based on the state of the clock as stored.

16. The method of claim 15, wherein the voltage generator includes a charge pump, and the method further comprises:
   prior to reactivating the voltage generator, precharging nodes internal to the charge pump to correspond to the state of the clock as stored.

17. The method of claim 14, wherein the voltage generator includes a charge pump, and the method further comprises:
   prior to reactivating the voltage generator, preparing the charge pump for reactivation.

18. The method of claim 14 further comprises driving a signal line as a part of the operation in the device, wherein driving the signal line uses charge stored at the node.

19. The method of claim 18, wherein the signal line is a word line in a memory device.

20. The method of claim 14, wherein reactivating the voltage generator includes providing a clock to the voltage generator.

* * * * *